United States Patent [19]

Félix

[11] 4,263,620
[45] Apr. 21, 1981

[54] PICTURE PICKUP TARGET AND READING DEVICE ASSEMBLY

[75] Inventor: Pierre Félix, Paris, France

[73] Assignee: Thomson-CSF, Paris, France

[21] Appl. No.: 22,686

[22] Filed: Mar. 21, 1979

[30] Foreign Application Priority Data

Mar. 24, 1978 [FR] France .................................. 78 08671

[51] Int. Cl.³ ............................................... H04N 3/14
[52] U.S. Cl. .................................................. 358/213
[58] Field of Search ................ 358/113, 209, 212, 213

[56] References Cited

U.S. PATENT DOCUMENTS

| | | | |
|---|---|---|---|
| 3,931,463 | 1/1976 | Levine | 358/213 |
| 4,127,877 | 11/1978 | Morishita et al. | 358/213 |
| 4,153,915 | 5/1979 | McKechnie | 358/213 |

Primary Examiner—Richard Murray
Attorney, Agent, or Firm—Roland Plottel

[57] ABSTRACT

Device for reading a picture pickup target and assembly constituted by the target and such a reading device.

The target I takes the form of a matrix of detectors placed at the points of intersection of lines and rectangular columns. The reading device II comprises one input per line and for each line: (1) a channel A connected to said input wherein the signals of the points of the line are transferred in series and at the same time for all the columns in the line reading time $t_1$; (2) a storage channel B into which the signals of channel A are transferred in parallel and stored; (3) an evacuation channel C into which the signals from channel B are transferred in parallel and from which they are transferred to a reading register with a single input, to an amplifier therefrom and to the reading apparatus. Storage in B enables the signals to be processed, in particular integrated throughout the time comprised between $t_1$ and the register evacuation time.

12 Claims, 6 Drawing Figures

PICTURE PICKUP TARGET AND READING DEVICE ASSEMBLY

The present invention relates to a device for reading the signals furnished by the array of pinpoint detectors, or points, of a target for picture pickup under the effect of incident electromagnetic radiation striking the target in question. These detectors are arranged on the target in the form of a matrix, at the points of intersection of lines and colums normal to one another.

The invention applies in particular to the case of infrared radiation.

It also relates to the assembly constituted by the target an such a reading device, both of these being, in particular, of the solid state type.

It is generally advantageous to reduce as far as possible the time required to read the lines of a target and, consequentlyn the time for the target as a whole. This reduction, in fact, makes it possible, on one hand, to tolerate intense, continuous background currents and, on the other hand, dark currents, or currents in the absence of any incident radiation, that are greater and, consequently, all else being equal, to reduce the cooling of the target; it is thus possible to make use of the thermoelectric effect in preference to cryogenic means, in the case of targets for infrared radiation functioning quantically, that is to say by the creation of electron-hole pairs in the material of the target by the incident photons. Such targets known in the art use substrates of lead and tin telluride, for example, on which photosensitive junctions are formed. In the case of pyroelectric targets which function through the eduction of the target material, the same reduction makes it possible to obtain improved spatial resolution through the resulting reduction of lateral heat diffusion about the point of incidence; this diffusion is proportional to the square root of the line reading time in question.

Now, in picture pickup systems, there is generally a single output linked up either with the single input of the reading system, a cathode ray tube for television receivers, in particular, on the screen of which the signals of the target are displayed. In such a system, the signals of the detectors are transmitted one after another through a single register to the display unit, at a speed determined by the picture standard selected. Two successive signals from the same point on the target are transmitted to the display screen at a time interval equal to that allotted for scanning the whole of the image in the standard selected; this time is the time of image field scanning; it is in the order of a few tens of milliseconds in the case of the usual standards. As to the time taken to scan one line in the same target, this is in the order of a few tens of microseconds, in the case of a line with 500 points with a clock time of 1/10 of a microsecond, as in infrared applications; the clock time is that which separates the reading of the signal of one point from that of the following point in the same line.

There would therefore be a considerable differential between the time interval separating two successive displays of one and the same point of the target on the output screen and that separating two successive signal samplings, or interrogations, of the same point in a line, in a system in which each line of the target provided with its own system of transmission to the output register mentioned above is read separately. This differential is all the greater; in the case of a given standard, in that the time taken to read a line is reduced for various reasons, such as those given above in the case of infrared applications.

The invention takes advantage of this situation in order to provide a device for reading a matrix of detectors of electromagnetic radiation wherein this differential is ised to apply various treatments to the signals of the points, liable to improve the quality of the final image under conditions that will be described below. These treatments are effected during the time available between the arrival of the point signals of a line in the reading device and their leaving the terminal register.

These conditions will be specified in two cases, the case in which the target has a sufficient surface area to receive the entire field of the vision via the appropriate optical system, and that in which its surface area, being confined to only a few colums for example, enables it to receive only a part thereof.

The invention will be more readily understood with reference to the following description and to the attached figures, wherein.

Figure 1:
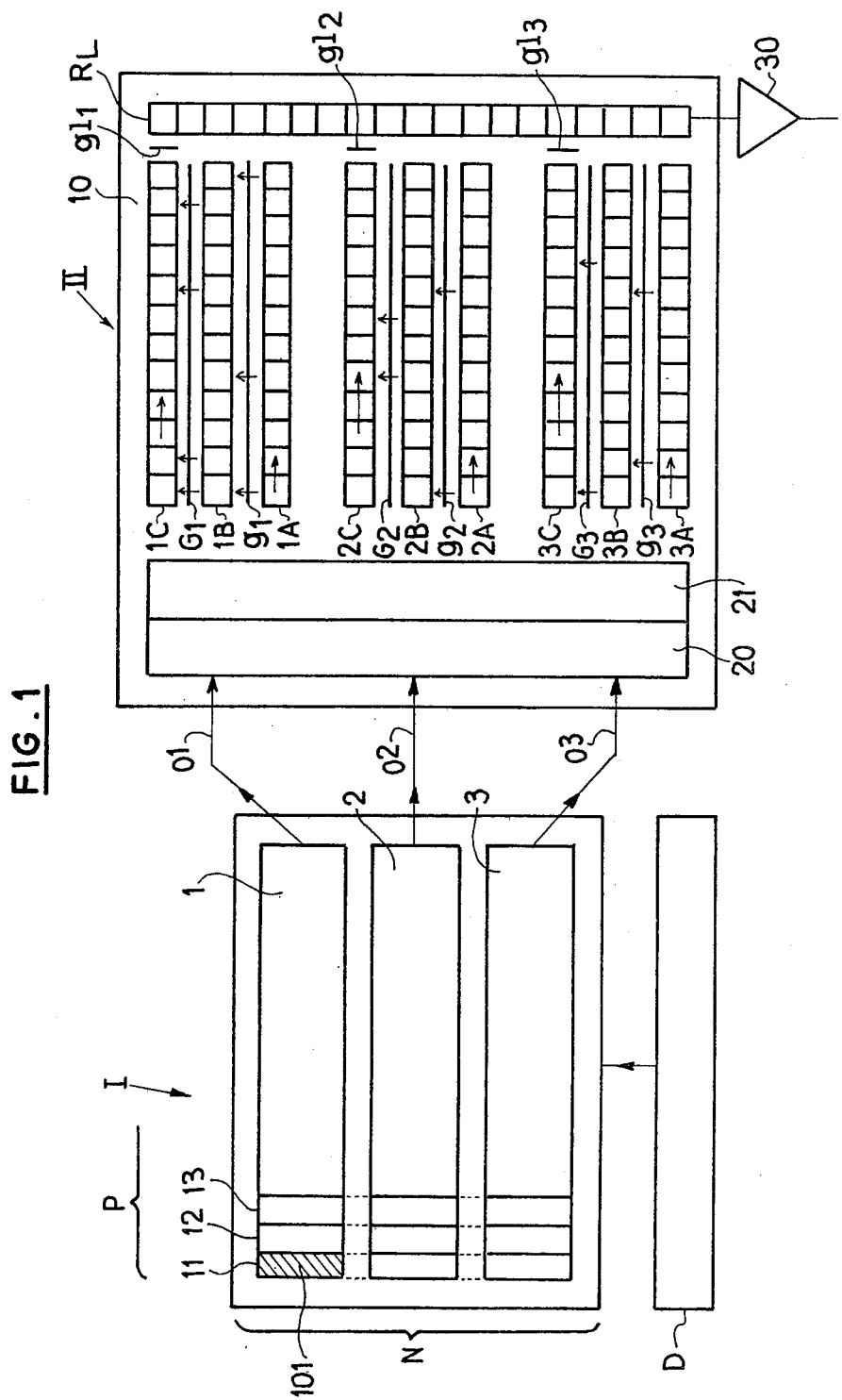
FIGS. 1 and 2 represent diagrams showing the assembly of the target and the reading device of the invention in the case of two types of target structure.

FIG. 1 diagrammatically represents an assembly composed of a target I and of the reading device II according to the invention which is associated therewith. In this diagram, for the sake of simplicity, only three lines of the target have been represented, in the form of the three rectangles marked 1, 2 and 3. The target as a whole in fact comprises N lines and P columns, each of the radiation detectors being placed, al already stated, at the junction between a line and a column; three of said columns have been illustrated by way of example and allotted reference numbers 11, 12 and 13. Reference number 101 identifies one of the detection points of the target, represented by the small rectangle shaded in; the points, like the columns, have bben represented as contiguous in this diagram, although, in reality, there is no contact between them. All the lines are identical with one another and composed of P identical basic detection points in which the signal constituted by electrical charges generated in the detectors by incident radiation are detected and stored. Each line has an output via which it is connected, as indicated by the arrows 01, 02 and 03, to part II of the figure, that is to say to the reading system. All the lines are read in parallel at the same time or, which amounts to the same thing, the N points in one and the same column are read simultaneously. In the figure, D represents the target reading register, that is to say the combination of electronic control means permitting the sequential addressing of the columns in accordance with procedures that depend on the nature of the means for sampling and transferring the target signals. This sampling is advantageously effected, within the scope of the invention, using solid state means, by charge transfer elements now known in the art by the name of charge transfer devices (CTD) or charge coupled devices (CCD) in English literature, or by the name of charge injection device (CID) in the same literature. The N signals of the points in a column of the matrix reach the line outputs (01, 02, 03) simultaneously.

The time taken to read all the points of a line in the target, or line scanning time, is called $t_1$; according to the above discussion, this is the time that intervenes between two successive readings of one and the same column and of the same point in each line. The integration time of a detector, that is to say the time for which the electrical charges generated by incident radiation in the detector are accumulated in said detector, is designated by $t_i$. This time is limited to a value $t_2$ ($t_s > t_i$), beyond which no further accumulation takes place, as the detector is saturated; it goes without saying that it is arranged for time $t_1$ to be less than the saturation time $t_s$ since, if the contrary were true, between two readings of the same point, the saturation level of the detector would be reached and no further meaningful reading of the quantity of photons that had actually reached this point between said two readings would be possible. It is possible, however, even with a detector saturation time less than the line scanning time, to use the target by slightly delaying the start of integration of the charges generated in the detectors by the photons.

Be this as it may, the fact remains that, with short reading times $t_1$, one is a liberty to select short saturation time $t_2$, that is to say, as already stated, in particular, higher dark or continuous background currents, with the advantages that this entails in operating the target. The integration time $t_i$ can then be as close as possible to the reading time $t_1$, that is to say that it will be possible to take into account in this integration of practically all the incident photons that have reached the detector between two successive reading operations; we shall then have a $t_i/t_1$ close to 1, which would not be possible with a target having only one output as opposed to one output per line. To recapitulate, we shall obtain: $t_i \cong t_1 < t_s$.

The right-hand portion of the figure, marked II, shows the reading device of the invention associated with the target I. In the example, this device is constituted by a silicon plate 10. It includes N amplifying inputs, one for each target line output, at the tips of the arrow 01, 02, 03 in the figure, represented as a whole by the rectangle referenced 20. In these inputs are integrated, for example, the electrical circuits enabling the reverse biasing, at a reference potential $V_r$, of diodes or SIM (semiconductor insulating metal) structures formed, for example, in the silicon. The device also comprises N inputs of charge transfert devices bearing the general reference number 21; each of the latter inputs provides for injection of the signals into a charge transfer channel, referenced 1A in the case of line 1, 2A in that of line 2 and 3A in that of line 3 of the target, for example.

Each channel A enables the storage of the signals of the P points of a target line in P storage elements diagrammatically represented by the small, horizontally aligned contiguous squares. Each of these squares represent a cell of the charge transfer channel, known in the art and which will not be discussed at length. It is known that transfer from cell to cell takes place in such a channel by means of gates whose number is equal to the number of phases used for said transfer and to which the bias is applied with a given phase. The N channels of type A, such as 1A, 2A, 3A, are filled simultaneously by charge transfer from one square to the next by means of a phase switching system, in synchronism with reading of the target columns. This transfer along the columns is diagrammatically represented by the arrows inside the rectangle 1A, 2A, 3A. The complete transfer from the left-hand end to the right-hand end of the channel is effected within the time $t_1$ mentioned above; at the end of this time, the signals of all the detectors of the corresponding line of the target have been transferred through this channel with an integration time of $t_i$. After the A type channels (1A), 2A, 3A) have been filled, the accumulated charges are transferred, by simultaneously switching the transfer gates $g_1$, $g_2$, $g_3$, into other charge transfer channels of the B type, bearing reference numbers 1B, 2B, 3B in the drawing and comprising the same number P of elements as those of the A type, which are also represented by the small contiguous squares.

Charge transfer from the A channels to the B channels takes place from an element in the A channel to that located opposite in the B channel, as indicated by the small vertical arrows between said channels. This transfer operation is repeated several times with a recurrence time equal to the line timbe $t_1$. In the device according to the invention, there are thus successive accumulations of signals from one point of the target. After said accumulation, the charges stored in this way in the elements of type B are transferred into channels of type C, bearing reference number 1C in the case of line 1 and 2C and 3C in that of the other two lines, f from one element to the element opposite thereto (vertical arrows) by simultaneously switching the transfer gates $G_1$, $G_2$, $G_3$. The charges accumulated in the C channels are then evacuated to the reading register $R_L$ by longitudinal transfer as indicated by the small horizontal arrows inside the C type channels. This latter transfer operation takes place at a slower rate than the rate of transfer in the A channels; it is effected by simultaneously switching the transfer gates of all the lines, referenced $g1_1$, $g1_2$, $g1_3$ in the case of the three lines represented in the figure. The register $R_L$ is, in the example, a charge transfer register as for the channels described above and whose cells are also represented by small squares. It is evacuated by stepwise charge transfer towards amplifier 30; said amplifier is a video amplifier if the device is designed for television reception. It is itself designed for integration in the silicon substrate 10 and connected to the reading means not represented. The register $R_L$ is evacuated in a time $t_1$ of all of a television signals in the example. It is to be noted that this line is formed by the points of a column of the target. At the end of each register reading operation, hence with a recurrence time equal to $t_1$, the charges stored in the cells of the C type channels are transferred in the direction indicated by the arrows in these channels, thus being conveyed to the following cell in the channel, and the gates $g1_1$, $g1_2$, $g1_3$ are again switched simultaneously to permit transfer from channel C to register $R_L$.

In the above description, which corresponds to a case wherein the N lines and P columns of the target are sufficiently numerous to receive the incident radiation from the entire area of the image to be visually represented, corresponding, for example, to N=P=500, the signal charges stored in the A channels are transferred with a recurrence time of $t_1$ into the B channels and stored in said channels for a total time that we shall call $T_i$, which can be in the order of time $T_t$ required for reading wholly a channel C and all of its likes. This time is identical to the field scanning time in the case of video amplifier 30 supplying a television receiver, as assumed in the example, that is to say the time taken for reading a complete image of the standard selected, in the order of a few tens of milliseconds. The above, adjustable, time $T_i$ is the integration time for the points of the television field. It is far greater than the time $t_i$ previously defined for the target. In the B channels of the device according to the invention, the charges from the target detectors are thus stored for a time $T_i$, during which the successive integration operations described in connection with said channels take place, and stored for a total time of $T_t$. At the end of a field, when the C channels have been completely evacuated into reading register $R_L$, the charges contained in the B channels are transferred into the C channels, where they are read in a field scanning time $T_t$, and so on. The reading device II thus ensures parallel conversion between the N inputs, 01, 02, 03 ... and the single output of register $R_L$ to amplifier 30. It permits integration during the time $T_i$ in the order of $T_t$, hence for a time far greater than the integration time $t_i$ of the target itself; the device plays the part of a field integrator and consequently makes for a considerable improvement in the signal to noise ratio. Naturally, this result can only be achieved with substrates (plate 10) themselves having a low dark current enabling such integration to take place conveniently; this is precisely the case of the silicon plates at present available and whose dark currents are far lower than those of the target materials; the latter are, to recapitulate, in particular lead and tin telluride, etc.

The device also enables the standard to be converted owing to the times of storage between channels A and C; it enables the field scanning time to be adapted to that of a conventional standard.

The same device also enables picture pickup in a second case, namely one wherein the surface of the target, which is too small, can receive only a part of the image to be reproduced. We shall assume that said target comprises N lines, as before, but only a few columns, namely p columns, as opposed to the previous number P (p less than P). As in the preceding case, said N lines cover the area of the image received, via the optical system placed in front of the target, in one of its dimensions, while the p columns only partially cover same in the other dimension.

Figure 2:
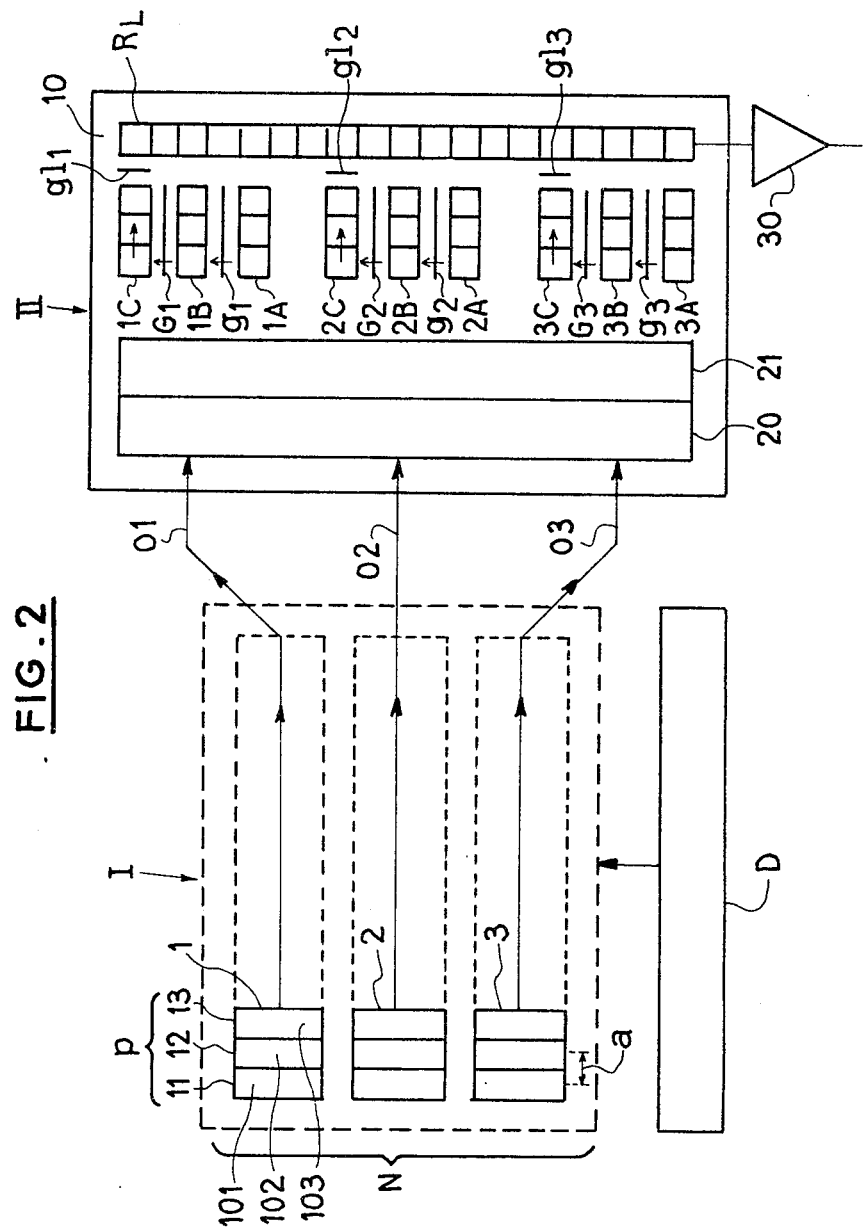

The target would then have, as shown in FIG. 2, the N lines of the preceding example, only three of which have been represented as in FIG. 1; the target comprises three columns only (p=3), this time; this number, three, has not been selected in order to simplify illustration but because in fact, the target has only three. The dotted lines in FIG. 2 represent the contours that part I would have to possess in order to cover the entire field of vision; these contours are the same as in FIG. 1. As to part II, its channels 1A, 1B, 1C, 2A ..., as will be seen herebelow, each comprise three cells.

In the case of FIG. 2, it will be appreciated that relative movement of the target with regard to the incident image can enable all the portions of the incident image to be transmitted in succession to the limited number of columns of the target. Said relative movement can be effected either by displacement of the target in relation to the optics via which the image is transmitted, or by displacement of the image in relation to the target, which remains fixed; the solution selected is of no importance within the scope of the invention; in both cases, however, this displacement is effected parallel to the direction of the lines in such a way as to convey all the portions of the image to the three columns of the target. In both of these cases, we shall continue to talk in terms of image lines, although, as apparent from the hypotheses characterising the second case, the target lines are incomplete.

The image lines that will be discussed are in this case simply those lines discussed in the case of FIG. 1 and whose length covered the full dimensions of the image normal to the columns. Projection of the image onto the target will take place on columns 11, 12, 13 from left to right of the figure for example in a direction normal to the columns of said figure. Its displacement will be at a constant speed which will be designated v; the points of these columns belonging to the first line are marked 101, 102 and 103 in FIG. 2.

Under these circumstances, it can be seen that a given point of the image that is located at a given moment t at a point 101 in column 11 of the target, that is to say on the detector placed at this point, is located on point 102 of column 12 located on the same line after a time $\tau = a/v$, if a is taken as the pitch, which is constant of the columns of the target, that is to say the distance between two successive detectors in the same line; it is located on point 103 of column 13 which follows it on the same line after the time $2\rho = 2a/v$.

Addition of these three signals, given by the detectors 101, 102, 103 for the same point of the image, improves the signal to noise ratio of this point of the image, but this addition must be effected taking into account the phase shifts designated by $\tau$ and $2\tau$ between said signals. For this purpose it is necessary to apply to each of them the delay required to replace it in phase with the preceding signal.

The semiconductor device II of the invention in fact enables these delay operations to be carried out and permits addition of the signals of the three points in the line of the target (and its columns).

For this purpose, after the charges generated in the three detectors of a line, such as 101, 102, 103, have been transferred into the A channels (1A in the case of the upper line of the target on the drawing) in a time equal to the time $t_1$ taken to read a line of the target, by biasing the gates g as in the preceding case, they are transferred to the B channels (1B in the case of the line in question) with a recurrence time $t_1$ and are stored in these channels for a time equal to $\tau$. This integration time $\tau$ can be equal to $T_i$ defined above. They are then transferred into the C type channels, 1C in the case of the line in question, by actuating the gates G, with a recurrence time of $\tau$. At the same time, the charges in the C channels are staggered from one cell to the next towards the exit, in the direction of register $R_L$. This operation is, in fact, equivalent to adding to the signal of a given point on the target that of the preceding column, delayed by a time $\tau$, that is to say to adding said two signals in phase. The operation is repeated for the column preceding the latter.

The same operation is effected simultaneously for all the lines of the target, which are read in parallel as indicated above.

At the end of these transfer operations, the signal corresponding to the sum of the signals of the detectors of all the target columns is stored for each line in the last cell of the C channels, the cell closest to the register $R_L$: the three columns in the example, in which the A, B, C channels each comprise three cells for this reason. Said signal is then transferred to register $R_L$ in a time shorter than or equal to $\tau$.

We have said that said time $\tau$ can be equal to $T_i$, the integration time for the field of the standard of the image supplied by amplifier 30, which time is far greater than time $t_1$ taken to read a line of the target. It can also be substantially shorter and equal, in fact, to said time $t_1$. In this case, it will be noted that the successive operations of storage in the B channels become unnecessary; the signal charges are then directly transferred from the A channels to the C channels, without storage in the B chanels, by successively applying the potentials required to the gates g and G. The delay time $\tau$ can be adjusted practically continuously between the times $t_1$ and $T_i$, and even $T_t$, the field scanning time for the final image, by varying the speed of relative movement v. This is one of the advantages of the invention in relation to known reading devices possessing only one output for the target and wherein the delay time $\tau$ would be necessarily be equal to the field scanning time $T_t$, which means that they are less flexible to use.

A description has been given above of the way in which the signals of a line would be added in phase in the case of an incomplete target, within the device II. It goies without saying that this treatment also applies to the means of the device II in the case of a complete target. This case would correspond to that of a complete target used for panoramic monitoring.

The following is a description of an additional possibility offered by the reading device according to the invention and applicable to the two cases discussed above, namely that of a complete target and that of a target comprising only a few columns. This possibility relates to treatment of a signal enabling partial correction of the dispersion between the responses of the different detectors going to make up the target under uniform incident radiation; said dispersion is a constant phenomenon occuring in the design of picture pickup targets. Such partial correction can be sufficient in the case of in-phase addition of the p columns, that is to say the second case discussed, wherein said dispersion of responses is already divided by $\sqrt{p}$ by constrast with the case in which the columns are not added.

Figure 3:
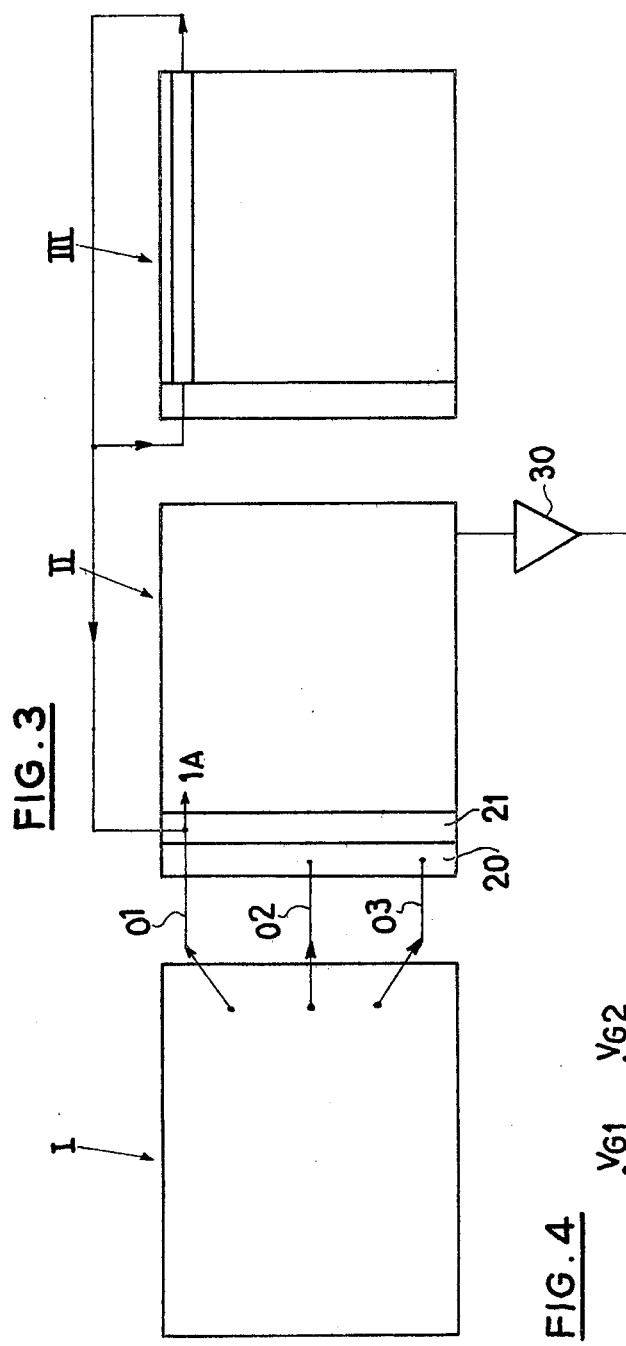
FIG. 3 is a view similar to that in FIG. 1, in an alternative embodiment of the invention incorporating a device for correcting dispersion.

This treatment consists in subtracting from the signal of each detector the signal generated in the same detector by a fixed incident radiation. There will be a difference of $Sij - Sijl$, wherein $Sij$ designates the signal of the detector (line i, column j) under the effect of the incident radiation of the image, while $Sijl$ designates that of the same detector in the case of a given radiation $H_1$, which is the same for all the detectors. This treatment necessitates the addition to the assembly of the target and the reading device (I,II) of FIGS. 1 and 2, of a third memory element in which the signals $Sijl$ are stored. Such a unit is illustrated in FIG. 3.

The memory III in question is, in the example, a circulating memory with N lines, each with P cells, i.e. $N \times P$ bits, which can be "refreshed" periodically by the introduction of new signals $Sijl$ generated at regular intervals by the exposure of the target to the uniform incident radiation $H_1$. The difference $Sij - Sijl$ is formed at the inputs of the reading device II. As illustrated in FIG. 3, the information of the N lines of the memory are extracted from the memory in synchronism with the injection of the target lines into the A channels of reading device II and reinjected into said channels. The vertical arrow between parts II and III sylbolically represents the insertion of the signals $Sijl$ into the memory; only one line of said memory is represented in the figure and a detailed illustration of parts I and II, which are the same as in FIG. 1, has been deliberately omitted.

Figure 4:
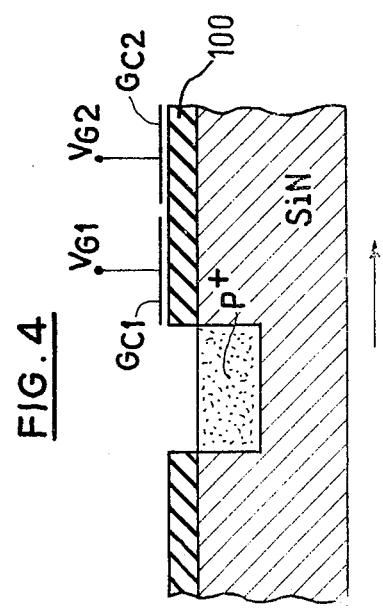
FIG. 4 shows a detail of the above dispersion corrector.

To facilitate understanding, FIG. 4 shows an example of the way in which the differences $Sij - Sijl$ are injected into the A channels when the reading device II uses charge transfer cells formed in the silicon substrate 10, as discussed earlier. The figure represents the input of a line of the reading device. The $P^+$ diffusion in the N type silicon substrate (SiN) is directly polarized in a first stage in order to fill the potential wells beneath the gates GC1 and GC2, applied to the insulating material 100. It is then reverse biased at the same time as the signal $Sij$ is applied to gate GC2 and signal $Sijl$ to gate GC1. The charge remaining beneath gate GC2 after balacing the two potentials at the semiconductor insulating interface beneath gates $VG_1$ and $VG_2$ is then proportional to $Sij - Sijl$. This charge is then transferred to the corresponding A channel in the direction of the arrow.

The operation $Sij - Sijl$ effected at the input of the reading device is equivalent to "de-basing" the signal $Sij$ by substracting part of the continuous background generated by the ambient radiation. This reduction of signal $Sij$, all else being equal, enables a greater number of successive storage operations in the B channels, that is to say a longer integration time $T_i$ in the reading device, hence a better signal to noise ratio.

It can be seen from the above that the device according to the invention makes it possible to perform various functions in processing the signal of the target associated therewith by serial and parallel and serial transfers as explained above.

Figure 5:
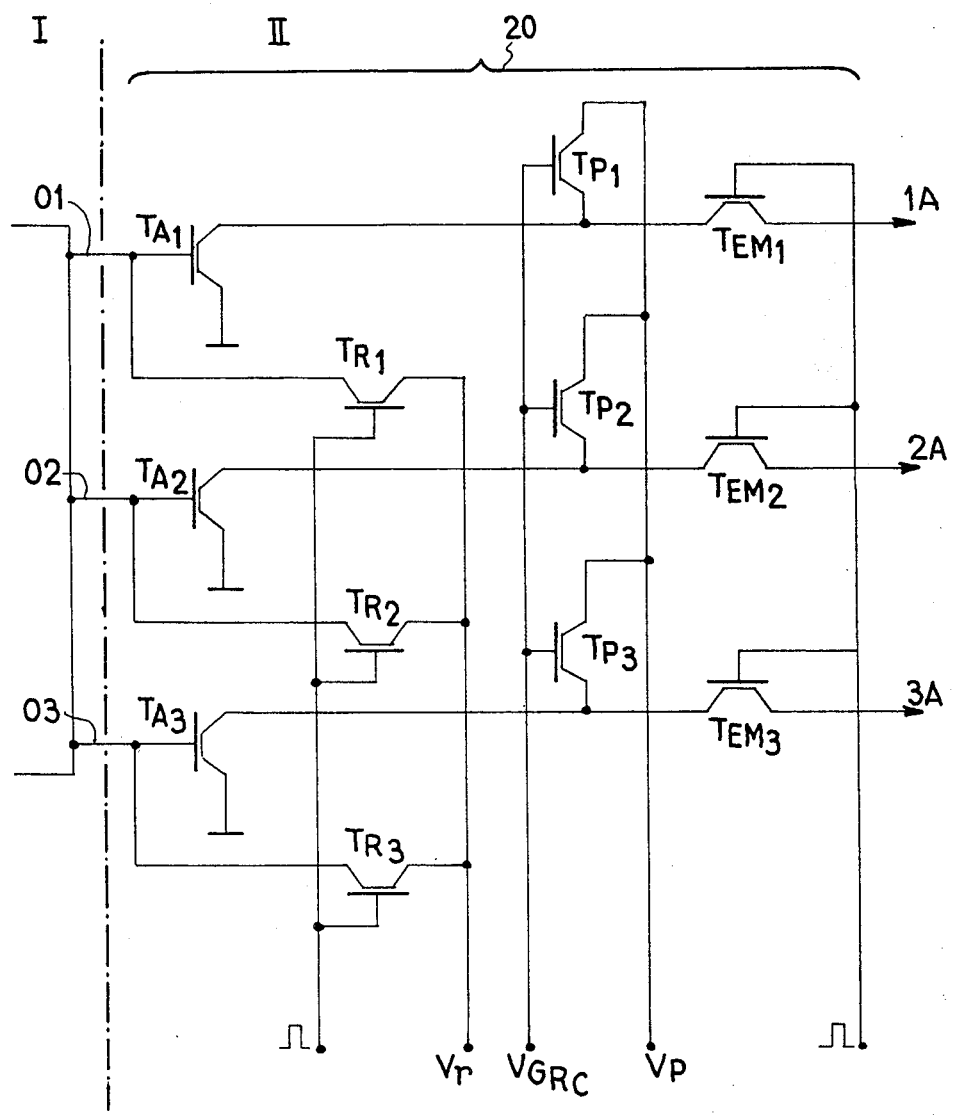
FIG. 5 is a wiring diagram of the input of the reading device shown in FIGS. 1 and 2.

FIG. 5, wherein the same reference numbers are used to represent the same elements as in the preceding figures, diagrammatically represents an example of the structure of the input of reading device II using metal oxide semiconductor technology (MOS).

In said figure, $T_{A1}$, $T_{A2}$, $T_{A3}$ are the amplifying transistors and the transistors $T_{P1}$, $T_{P2}$ and $T_{P3}$ are transistors used as load resistors: their channel resistance polarized by the voltage $V_p$ is modulated by the gate voltage $V_{GRC}$. The transistors $T_{R1}$, $T_{R2}$, $T_{R3}$ enable zero setting: they are conductive at the time of the gate pulse, and return the target outputs to the reference potential Vr before the reading of each column. Finally, $T_{EM1}$, $T_{EM2}$ and $T_{EM3}$ in this figure represent sampling and holding transistors made conductive by the sampling pulse at the time each column is read, and which are in cut-off condition for the remainder of the time in order to maintain the voltage read at the input side of the transfer channels. In the figure, the right-hand arrows point in the direction of these inputs, that is to say the A type channels.

Finally, the invention has been described on the assumption that the target comprised one output for each line of detectors, and that the reading device comprised the same number of inputs, each one being connected to one of the above outputs. The invention also applies to a case in which several lines of detectors (n lines; n a sub-multiple of N) of the target are grouped together in such a way as to form a single common output. The only difference in relation to the case described above is that each detector of the target would only be re-read after the time $nt_1$ (instead of $t_1$), $t_1$ still indicating the time taken to read one line of the target; the limit of the integration time $t_i$ in the target would be $nt_1$ in this case as well.

As to the reading device, this would continue, as in the examples described, to comprise N inputs and a multiplexing system enabling each of the target lines to be addressed successively in the channels of the reading device.

Figure 6:
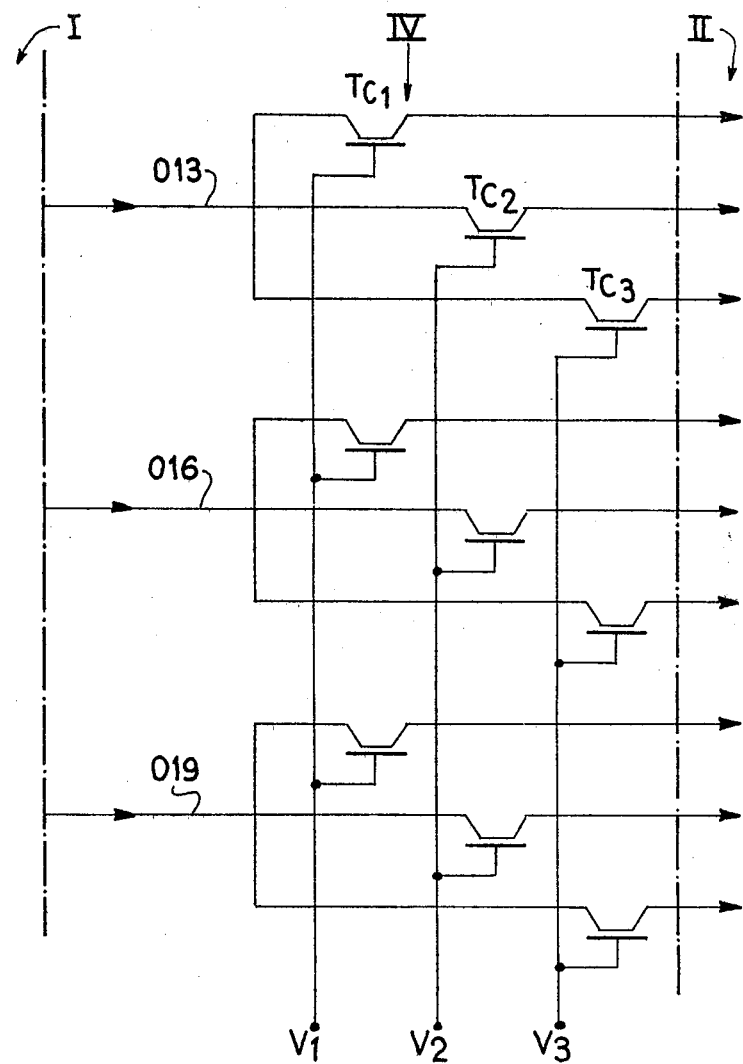
FIG. 6 is the wiring diagram of a multiplexing device used in certain alternative forms of embodiments of the invention.

FIG. 6 diagrammatically represents an example of the multiplexing system IV, for n=3; the target is assumed to comprise three such groups, that is to say nine lines. In each of these groups, the transistors such as $TC_1$ are maintained in conductive condition, while the other two are kept in cut-off condition by the voltages $V_1$, $V_2$, $V_3$, these conditions succeeding one another by circular permutation. The outputs of the target are referenced 013, 016 and 019 to each of which correspond three inputs in the A type channels of the reading device. These inputs are provided in the direction of the arrows on the right-hand side of the figure, towards channels 1A, 2A and 3A of the proceding figures for the first three lines of the target, that is to say for group 013. In each group, after injection of the signals of the first line into the reading device, the second line is injected, then the third, and then the first once more, and so on.

The case of a target with N/n outputs each grouping together n lines occurs in particular when the matrix with N×P detector elements is designed using N/n modules of n×P elements each comprising only a single output.

It goes without saying that the invention includes assemblies comprising both the correction device III and the multiplexing system IV illustrated in FIGS. 3 and 6 respectively, this being both in the case of targets with N lines and P columns as in FIG. 1 and in that of targets with p columns only, as in FIG. 2.

Of course, the invention is not limited to the embodiment described and shown, which were given solely by way of example.

What is claimed is:

1. An Assembly formed by a picture pickup target and a device for reading the same which target is composed of a matrix of pinpoint detectors, or points of the target placed at the intersection points of N lines and P rectangular columns, exposed to radiation from the image area and supplying and electrical signal under its effect, said device being characterised in that it comprises one input per target line and an output register comprising only one output connected to the input of a reading apparatus and in that it comprises, for each line, arranged between said inputs and said register, means performing the following functions simultaneously for all said lines:
    (a) reception in A channels of the signals of the detectors in the line in order of addressing selected, and transfer along these channels in a time $t_1$ designated as the target line reading time;
    (b) transfer in parallel of these signals to storage units B with a recurrence time equal to the line reading time $t_1$;
    (c) transfer in parallel of the signals stored in the B channels into evacuation channels C with the same recurrence time $t_1$;
    (d) transfer in series of these signals along said evacuation channels C;
    (e) transfer of these signals to the output register, the time for evacuating all of the signals received by the output register being equal to that taken to read a picture in the reading apparatus.

2. Assembly according to claim 1, characterised in that, before the transfer to the evacuation channels C, the transfers in channels B are repeated throughout all or a part of the time required for the complete evacuation of the C channels, said repeated transfers ensuring the integration in said channels of the signals received by each detector during this time.

3. Assembly according to claim 2; characterised in that, said reading apparatus being a television reception screen, the evacuation time for the C channels is equal to the field scanning time $T_t$ for the image given by said receiver.

4. Assembly formed by a picture pickup target and a device for reading the same, which target is composed of a matrix of pinpoints detectors, or points of the target, placed at the intersection points of N lines and P rectangular columns, exposed to incident radiation from the image area and supplying an electrical signal under its effect, wherein said pinpoint detector take up on the target in the direction of the lines only one part of the surface reached by the incident radiation from image area, that is to say a number of columns that is smaller than that required to cover the entire surface reached onto the target by the incident radiation from image area, said device being characterised in that it comprises one input per target line and an output register comprising only one output connected to the input of a reading apparatus, and in that it comprises, for each line, arranged between said inputs and said register, means performing the following functions simultaneously for all said lines:
    (a) reception in A channels of the signals of the detectors in the line in the order of addressing selected, and transfer along these channels in a time $t_1$ designated as the target line reading time;
    (b) transfer in parallel of these signals to storage units B with a recurrence time equal to the line reading time $t_1$;
    (c) transfer in parallel of the signals stored in the B channels into evacuation channels C with the same recurrence time $t_1$;
    (d) transfer in series of these signals along said evacuation channels C;
    (e) transfer of these signals to the output register, the time for evacuating all of the signals received by the output register being equal to that taken to read a picture in the reading apparatus;
    (f) means for advancing the signals one row towards the output register between two successive transfers of the signals in storage channels B to the evacuation channels C.

5. Assembly according to claim 4, wherein the target and the image area are subjected to relative displacement in a direction normal to the columns at a constant speed v so as to convey the incident radiation from the image area to said columns in successive sections, a dencting the pitch of said columns, that is to say the distance between two successive detectors in the same line, characterised in that the transfer by the means (c) to the evacuation channels takes place with a recurrence time $\tau$ equal to $a/v (\tau = a/v)$, that is to say the time required for a point of the image to move in said relative displacement from one column to the next, and characterised in that said transfer to the output register takes place with the same recurrence time $\tau$, said assembly ensuring the addition in phase of the signals, for the same point of the image, received by the detectors in one and the same line, during said relative displacement.

6. Assembly according to claim 5, characterised in that the time $\tau$ is set to a value well in excess of $t_1$, said assembly ensuring the integration of the signals received by each detector during this time.

7. Assembly according to claim 6, characterised in that, said reading apparatus being a television reception screen, the time $\tau$ is equal to the integration time of the image in said receiver.

8. Assembly according to claim 5, characterised in that the time $\tau$ is substantially equal to the time $t_1$ and in that the transfer from the A channels to the C channels takes place directly without going through the B channels.

9. Device according to claim 1 or claim 4, characterised in that said means (a) to (f) are charge transfer devices provided in a silicon substrate.

10. Assembly according to one of claims 1 or 4, characterised in that it additionally includes a circulating memory whose bits are disposed like the detectors of the target at the intersection points of lines and columns, in which bits are stored the signals supplied by the detectors of the target under the effect of uniform incident radiation, said memory being provided with means for extracting said signals in synchronism with the corresponding ones of the target detectors, means for subtracting them from one another and means for injecting said differences into the reading device.

11. Assembly according to claim 1 or claim 4, characterised in that said target comprises one output per line.

12. Assembly according to claim 1 or claim 4, characterised in that said target comprises one output per group of n successive lines, n being an integer that is a submultiple of the number N of lines in the target and in that it additionally comprises, between the target and the reading device, a multiplexing system providing line by line transfer of the signals of each group to one of the inputs of the reading device.

* * * * *